United States Patent [19]
Kawazu et al.

[11] Patent Number: 5,764,673
[45] Date of Patent: Jun. 9, 1998

[54] SEMICONDUCTOR LIGHT EMITTING DEVICE

[75] Inventors: Zempei Kawazu; Norio Hayafuji; Diethard Marx, all of Tokyo, Japan

[73] Assignee: Mitsubishi Denki Kabushiki Kaisha, Tokyo, Japan

[21] Appl. No.: 937,152

[22] Filed: Sep. 25, 1997

Related U.S. Application Data

[63] Continuation of Ser. No. 629,943, Apr. 12, 1996, abandoned.

[30] Foreign Application Priority Data

Sep. 25, 1995 [JP] Japan .................... 7-245611

[51] Int. Cl.$^6$ .................... H01S 3/19; H01L 31/0256
[52] U.S. Cl. .................... 372/45; 372/46; 257/76; 257/96
[58] Field of Search .................... 372/45, 46; 257/76, 257/96, 103

[56] References Cited

U.S. PATENT DOCUMENTS

| | | | |
|---|---|---|---|
| 3,849,707 | 11/1974 | Braslau et al. | 257/76 |
| 4,139,858 | 2/1979 | Pankove | 257/76 |
| 4,268,842 | 5/1981 | Jacob et al. | 257/76 |
| 4,623,425 | 11/1986 | Suzuki et al. | 156/613 |
| 4,903,088 | 2/1990 | Van Opdorp | 257/76 |
| 5,239,188 | 8/1993 | Takeuchi et al. | 257/76 |
| 5,247,533 | 9/1993 | Okazaki et al. | 372/45 |
| 5,290,393 | 3/1994 | Nakamura | 156/613 |
| 5,393,647 | 2/1995 | Neukermans et al. | 430/320 |
| 5,425,860 | 6/1995 | Truher et al. | 204/192.23 |
| 5,540,786 | 7/1996 | Xu et al. | 149/33.4 |
| 5,583,879 | 12/1996 | Yamazaki et al. | 372/45 |

FOREIGN PATENT DOCUMENTS

| | | |
|---|---|---|
| 0607435 | 7/1994 | European Pat. Off. . |
| 281482 | 3/1990 | Japan . |
| 289306 | 3/1990 | Japan . |
| 2178915 | 7/1990 | Japan . |
| 2229476 | 9/1990 | Japan . |
| 429023 | 1/1992 | Japan . |
| 4223330 | 8/1992 | Japan . |

OTHER PUBLICATIONS

Akasaki et al.; "Effects of AlN Buffer Layer on Crystallographic Structure and on Electrical and Optical Properties of GaN and Ga$_{1-x}$Al$_x$N(0<x>0.4) Films Grown on Sapphire Substrate by MOVPE"; Journal of Crystal Growth 98 (1989) 209–219. (No Month).

Nakamura et al.; "Candela–class high–brightness InGaN/AlGaN double–heterostructure blue–light–emitting diodes"; Appl. Phys. Lett. 64 (13), pp. 1687–1689, 28, Mar. 1994.

(List continued on next page.)

*Primary Examiner*—Rodney B. Bovernick
*Assistant Examiner*—Quyen Phan Leung
*Attorney, Agent, or Firm*—Leydig, Voit & Mayer, Ltd.

[57] ABSTRACT

A semiconductor light emitting device includes an Si substrate having opposed front and rear surfaces; an amorphous or polycrystalline first buffer layer disposed on the front surface of the Si substrate; and GaN series compound semiconductor layers successively disposed on the first buffer layer and including a light emitting region where light is produced by recombination of electrons and holes. In this light emitting device, since the Si substrate is cleavable, it is possible to produce resonator facets by cleaving. In addition, since the Si substrate is electrically conductive, a structure in which a pair of electrodes are respectively located on opposed upper and lower surfaces of the light emitting device is realized. Further, since the Si substrate is inexpensive, the light emitting device is obtained at low cost. Furthermore, since the amorphous or polycrystalline first buffer layer is disposed on the Si substrate, in the initial state of the growth of the GaN series compound semiconductor layers, plenty of growth nuclei are created, and the growth nuclei promote two-dimensional growth. As a result, high-quality GaN series compound semiconductor layers are obtained.

3 Claims, 4 Drawing Sheets

OTHER PUBLICATIONS

Sumakeris et al.; "Layer–by–layer epitaxial growth of GaN at low temperatures"; Thin Solid Films, 225 (1993) 244–249. (No Month).

T. Takeuchi et al., "Growth of single crystalline GaN film on Si substrate using 3C–SiC as an intermediate layer", J. of Crystal Growth, vol. 115, pp. 634–663, 8(1991). (No Month Available).

SEMICONDUCTOR LIGHT EMITTING DEVICE

This disclosure is a continuation of patent application Ser. No. 08/629,943, filed Apr. 12, 1996, now abandoned.

FIELD OF THE INVENTION

The present invention relates to a semiconductor light emitting device and, more particularly, to a light emitting device comprising gallium nitride and related compound semiconductors (hereinafter referred to as GaN series compound semiconductors) and used for a blue-light-emitting diode or a blue-light-emitting laser diode. The invention also relates to a method of fabricating the light emitting device.

BACKGROUND OF THE INVENTION

A III-V compound semiconductor nitride, $Al_xGa_yIn_zN$ ($0 \leq x, y, z \leq 1$, $x+y+z=1$), is promising as a material for light emitting devices producing visible and UV light because it has an energy band gap over a wide range from 1.9 eV to 6.4 eV and is a direct transition semiconductor.

However, since the vapor pressure of nitrogen is high, it is difficult to produce monocrystalline wafers of GaN series compound semiconductors. Therefore, in prior art optical devices, GaN series compound semiconductors are epitaxially grown on a sapphire substrate having a lattice constant proximate the lattice constants of GaN series compound semiconductors using a GaN or AlN buffer layer.

FIG. 6 is a cross-sectional view illustrating a structure of a blue-light-emitting diode (hereinafter referred to as a blue LED) disclosed in Applied Physics Letter Vol. 64 (1994), pp. 1687-1689. In the figure, reference numeral 41 designates a sapphire substrate. A GaN buffer layer 42 is disposed on the sapphire substrate 41. An n type GaN layer 43 is disposed on the GaN buffer layer 42. An n type AlGaN layer 44 is disposed on a part of the n type GaN layer 43. A Zn-doped InGaN layer 45 is disposed on the n type AlGaN layer 44. A p type AlGaN layer 46 is disposed on the Zn-doped InGaN layer 45. A p type GaN layer 47 is disposed on the p type AlGaN layer 46. A p side electrode 49 is disposed on the p type GaN layer 47. An n side electrode 48 is disposed on a part of the n type GaN layer 43. In operation, when a voltage is applied across the n side electrode 48 and the p side electrode 49, electrons and holes are injected into the Zn-doped InGaN layer 45 from the n side electrode 48 and the p side electrode 49, respectively. In the Zn-doped InGaN layer 45, the electrons and the holes recombine to produce light.

When GaN series compound semiconductor layers are grown on a sapphire substrate as in the prior art blue-LED shown in FIG. 6, since the sapphire substrate is electrically insulating, it is not possible to dispose an electrode on the rear surface of the substrate. In the blue-LED shown in FIG. 6, the n side electrode 48 is disposed on a portion of the GaN layer 43. Therefore, the structure of conventional light emitting devices in which a pair of electrodes are disposed on opposed upper and lower surfaces of the device cannot be realized. The blue-LED shown in FIG. 6 has the following drawbacks. When the blue-LED is subjected to an evaluating test, a probe contact jig, such as a probe card, used for the conventional light emitting device with the electrodes on the opposed upper and lower surfaces thereof cannot be used for the test. Further, in order to secure a space 43a for the electrode 48 on the GaN layer 43, portions of the epitaxially grown semiconductor layers 43 to 47 must be removed by dry etching.

When GaAs or InP substrate is employed, resonator facets are formed by cleaving. However, when a sapphire substrate is employed, since sapphire has no cleavability, a complicated process, such as dry etching, must be used for making resonator facets.

In order to avoid the above-described problems of a sapphire substrate, an electrically conducting SiC substrate having cleavability is sometimes employed. However, GaN series semiconductor layers grown on an SiC substrate are not as good in crystalline quality as those grown on a sapphire substrate. In addition, a light emitting device using a SiC substrate has not been reported. Further, since an SiC substrate is very expensive, it is difficult to obtain a large size and high quality SiC substrate.

SUMMARY OF THE INVENTION

It is an object of the present invention to provide a semiconductor light emitting device in which GaN series compound semiconductor layers are grown on an Si substrate that is inexpensive and has a high crystalline quality and that can be easily increased in size and reduced in resistance.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a semiconductor light emitting device comprises an Si substrate having opposed front and rear surfaces; an amorphous or polycrystalline first buffer layer disposed on the front surface of the Si substrate; and a plurality of GaN series compound semiconductor layers successively disposed on the first buffer layer and including a light emitting region where light is produced by recombination of electrons and holes. In this light emitting device, since the Si substrate has a cleavability, it is possible to produce resonator facets by cleaving. In addition, since the Si substrate has a conductivity, the structure in which a pair of electrodes are respectively located on opposed upper and lower surfaces of the light emitting device is realized. Further, since the Si substrate is inexpensive, the light emitting device is obtained at a low cost. Furthermore, since the amorphous or polycrystalline first buffer layer is disposed on the Si substrate, in the initial stage of the growth of the GaN series compound semiconductor layers, plenty of growth nucleuses are created, and the growth nucleuses promote two-dimensional growth. As a result, high-quality GaN series compound semiconductor layers are obtained.

According to a second aspect of the present invention, in the semiconductor light emitting device, the first buffer layer comprises Si or SiC. In this structure, since the Si or SiC first buffer layer is formed on the Si substrate, the generation of the growth nucleuses is further promoted, whereby the crystalline quality of the GaN series compound semiconductor layers is further improved.

According to a third aspect of the present invention, the semiconductor light emitting device further comprises an $Al_xGa_{1-x}N$ ($0 \leq x \leq 1$) second buffer layer disposed on the first buffer layer, and the GaN series compound semiconductor layers are disposed on the second buffer layer. In this structure, since the second buffer layer comprising a compound semiconductor of the same kind as the GaN series compound semiconductors is interposed between the first buffer layer and the GaN series compound semiconductor layers, the generation of the growth nucleuses is further promoted, whereby the crystalline quality of the GaN series compound semiconductor layers is further improved.

According to a fourth aspect of the present invention, the semiconductor light emitting device further comprises first and second electrodes for supplying electrons and holes to the light emitting region, and the first electrode is disposed on the rear surface of the Si substrate and the second electrode is disposed on the top of the GaN series compound semiconductor layers. In this structure, since the first and second electrodes are disposed on the opposed front and rear surfaces of the light emitting device, when the light emitting device is subjected to an evaluating test, a probe contact jig used for the conventional light emitting device can be used.

According to a fifth aspect of the present invention, a method of fabricating a semiconductor light emitting device comprises preparing an Si substrate having opposed front and rear surfaces; forming an amorphous or polycrystalline buffer layer on the front surface of the Si substrate; and successively growing a plurality of GaN series compound semiconductor layers on the buffer layer so that the GaN series compound semiconductor layers include a light emitting region where light is produced by recombination of electrons and holes. Therefore, in the initial stage of the growth of the GaN series compound semiconductor layers, plenty of growth nucleuses are created, and the growth nucleuses promote two-dimensional growth. As a result, high-quality GaN series compound semiconductor layers are obtained.

According to a sixth aspect of the present invention, in the above-described method, the buffer layer comprises Si or SiC. In this method, since the buffer layer comprising Si or SiC is formed on the Si substrate, the generation of the growth nucleuses is further promoted, whereby the crystalline quality of the GaN series compound semiconductor layers is further improved.

According to a seventh aspect of the present invention, in the above-described method, the buffer layer is formed by growing a first buffer layer comprising Si or SiC on the Si substrate and growing a second buffer layer comprising $Al_xGa_{1-x}N$ ($0 \leq x \leq 1$) on the first buffer layer. In this method, since the GaN series compound semiconductor layers are grown on the AlGaN second buffer layer, the generation of the growth nucleuses is further promoted, whereby the crystalline quality of the GaN series compound semiconductor layers is further improved.

According to an eighth aspect of the present invention, the above-described method further includes producing first and second electrodes for supplying the electrons and the holes to the light emitting region on the rear surface of the Si substrate and on the top of the GaN series compound semiconductor layers, respectively. In this method, since the first and second electrodes are produced on the opposed front and rear surfaces of the light emitting device, when the light emitting device is subjected to an evaluating test, a probe contact jig used for the conventional light emitting device can be used.

DETAILED DESCRIPTION OF THE PREFERRED EMBODIMENTS

Embodiment 1

Figure 1:
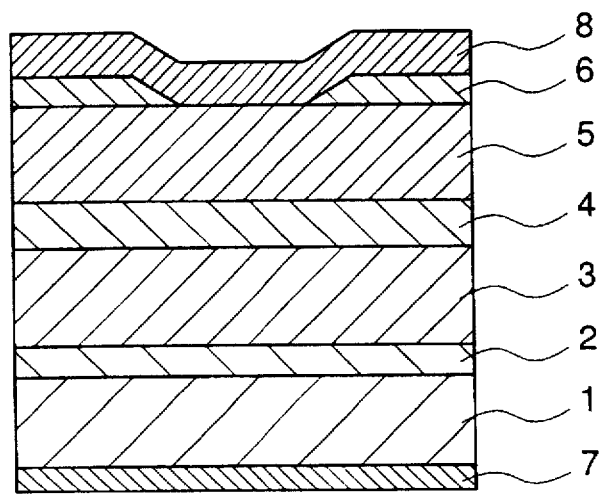
FIG. 1 is a cross-sectional view schematically illustrating a structure of a semiconductor laser in accordance with a first embodiment of the present invention.

FIG. 1 is a cross-sectional view schematically illustrating a structure of a semiconductor laser in accordance with a first embodiment of the present invention. In the figure, reference numeral 1 designates an Si substrate having opposed front and rear surfaces. An Si buffer layer 2 grown at a low temperature (hereinafter referred to as a low-temperature Si buffer layer) is disposed on the front surface of the Si substrate 1. A p type AlGaInN cladding layer 3 is disposed on the low-temperature Si buffer layer 2. An undoped AlGaInN active layer 4 is disposed on the p type AlGaInN cladding layer 3. An n type AlGaInN cladding layer 5 is disposed on the undoped AlGaInN active layer 4. A current blocking layer 6 comprising $SiO_2$ or the like is disposed on prescribed part of the n type AlGaInN cladding layer 5. An n side electrode 8 is disposed on a part of the n type AlGaInN cladding layer 5 where the current blocking layer 6 is absent and on the current blocking layer 6. A p side electrode 7 is disposed on the rear surface of the Si substrate 1.

Figure 2:
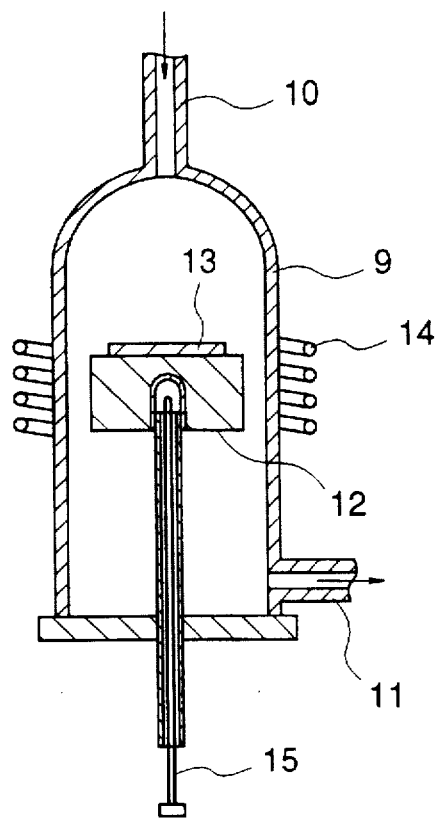
FIG. 2 is a cross-sectional view schematically illustrating a structure of an apparatus for fabricating the semiconductor laser shown in FIG. 1.

FIG. 2 is a cross-sectional view schematically illustrating a structure of an MOCVD apparatus used for fabricating the semiconductor laser shown in FIG. 1. In FIG. 2, an envelope 9 has a gas input port 10 at the top and a gas exhaust port 11 at the lower part. A mixture of source gases is introduced into the envelope 9 through the input port 10 and exhausted through the exhaust port 11. The envelope 9 contains a carbon susceptor 12, and a substrate 13 for the MOCVD growth is put on the susceptor 12. An RF induction heating coil 14 for heating the susceptor 12 surrounds the envelope 9 at a part where the susceptor 12 is located. Reference numeral 15 designates a thermocouple for measuring the temperature of the substrate 13.

A description is given of the process of fabricating the semiconductor laser according to the first embodiment of the invention. Initially, as a substrate 13 for the MOCVD growth, an Si substrate is put on the susceptor 12. Then, the substrate 13 is heated to about 1100° C. while introducing hydrogen into the envelope 9 through the gas input port 10, whereby thermal cleaning of the substrate 13 is performed. The pressure in the envelope 9 is set to atmospheric pressure or reduced with a rotary pump (not shown) connected to the exhaust port 11, according to the subsequent growth process.

After the thermal cleaning of the substrate 13, the temperature of the substrate 13 is set to 400°–800° C., and $Si_2H_6$ (disilane) is introduced into the envelope 9 to grow an amorphous or polycrystalline low-temperature Si buffer layer 2 on the substrate 13. When the growth is performed at a relatively low temperature within the range of 400°–800° C., an amorphous Si buffer layer is obtained. When the growth is performed at a relatively high temperature within that range, a polycrystalline Si buffer layer is obtained.

After the growth of the low-temperature Si buffer layer 2, the temperature of the substrate 13 is increased to 900°–1100° C., and $NH_3$, an organometallic Al compound, an organometallic Ga compound, and an organometallic In compound are introduced as N, Al, Ga, and In sources, respectively, whereby the p type AlGaInN cladding layer 3, the undoped AlGaInN active layer 4, and the n type AlGaInN layer 5 are successively grown. Preferably, the organometallic Al compound is $Al(CH_3)_3$ or $Al(C_2H_5)_3$, the organometallic Ga compound is $Ga(CH_3)_3$ or $Ga(C_2H_5)_3$, and the organometallic In compound is $In(CH_3)_3$ or $In(C_2H_5)_3$. Although $NH_3$ is employed as the N source, $N_2H_4$, $(CH_3)_2N_3$, $(CH_3)_2NH_2$, or $C_2H_5N_3$ may be employed. Simultaneously with the source gases, dopant source gases for the p type AlGaInN cladding layer 3 and the n type AlGaInN layer 5 are introduced. As an n type producing dopant source gas, a Si hydride, such as $SiH_4$ or $Si_2H_6$, an organometallic Si compound, such as $Si(CH_3)_4$; a Se compound, such as $H_2Se$, or an organometallic Se compound, such as $Se(CH_3)_2$, is employed. As a p type producing dopant source gas, an organometallic Mg compound, such as $Cp_2Mg$ (biscyclopentadienyl magnesium), $MCP_2Mg$ (bis-methylcyclopentadienyl magnesium), or i-$PrCp_2Mg$ (bis-isopropylcyclopentadienyl magnesium), or an organometallic Zn compound, such as $Zn(CH_3)_2$, is employed.

Thereafter, the current blocking layer 6 comprising $SiO_2$ or the like is produced on prescribed parts of the n type AlGaInN cladding layer 5, followed by fabrication of the p side electrode 7 and the n side electrode 8 on the rear surface and the front surface of the wafer, respectively. Finally, the wafer is cleaved to produce resonator facets, completing the semiconductor laser shown in FIG. 1.

In this first embodiment of the invention, since the Si substrate 1 is cleavable, the resonator facets can be produced by cleaving. In addition, since the Si substrate 1 is electrically conductive, a structure in which a pair of electrodes are respectively located on opposed upper and lower surfaces of a light emitting device is realized.

Therefore, when the semiconductor laser is subjected to an evaluating test, a probe contact jig used for the conventional light emitting device can be used. Further, since the Si substrate 1 is inexpensive, the semiconductor laser is obtained at a low cost.

If the GaN series compound semiconductor layers 3 to 5 are grown directly on the Si substrate 1, three-dimensional growth occurs, and the three-dimensional growth adversely affects the layer-by-layer growth of the GaN series compound semiconductor layers 3 to 5. In addition, the three-dimensional growth causes crystalline defects, such as dislocations, in the grown layers. In this first embodiment of the invention, however, since the amorphous or polycrystalline buffer layer 2 is produced on the Si substrate 1, in the initial stage of the growth of the GaN series compound semiconductor layers 3 to 5, plenty of growth nuclei are created with the amorphous or polycrystalline Si as a seed, and the growth nucleuses promote two-dimensional growth. As a result, high-quality GaN series compound semiconductor layers 3 to 5 are obtained.

Furthermore, since the uppermost AlGaInN cladding layer 5 is n type, incorporation of hydrogen into the p type cladding layer 3 is prevented, whereby a low-resistance p type AlGaInN cladding layer 3 is realized.

Embodiment 2

Figure 3:
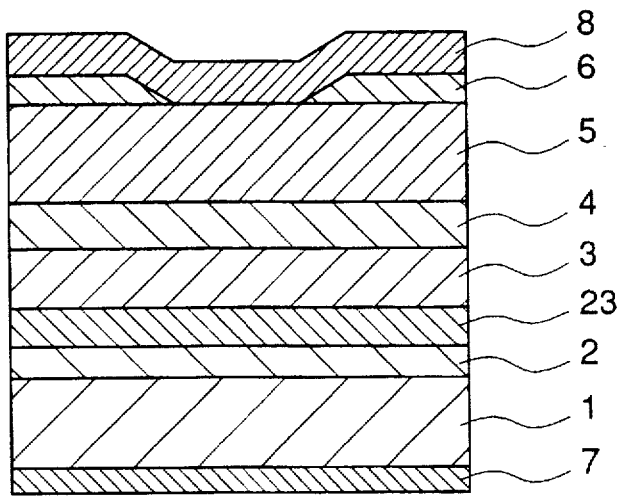
FIG. 3 is a cross-sectional view schematically illustrating a structure of a semiconductor laser in accordance with a second embodiment of the present invention.

FIG. 3 is a cross-sectional view schematically illustrating a structure of a semiconductor laser in accordance with a second embodiment of the present invention. In the figure, the same reference numerals as those in FIG. 1 designate the same or corresponding parts. In this second embodiment, a GaN buffer layer 23 (second buffer layer) is disposed on the low-temperature Si buffer layer 2 (first buffer layer), and the p type AlGaInN cladding layer 3, the undoped AlGaInN active layer 4, and the n type AlGaInN cladding layer 5 are disposed on the GaN buffer layer 23 in this order.

The semiconductor laser shown in FIG. 3 is fabricated in the process steps described hereinafter using the MOCVD apparatus shown in FIG. 2. Initially, the low-temperature Si buffer layer 2 is grown under the same conditions as described in the first embodiment. Thereafter, the temperature of the substrate 13 is set at 400°–700° C., and the buffer layer 23 comprising amorphous or polycrystalline GaN is grown with the amorphous or polycrystalline Si of the low-temperature Si buffer layer 2 to produce growth nuclei. Then, the AlGaInN semiconductor layers 3 to 5 are grown on the GaN buffer layer 23 in the same manner as described in the first embodiment, followed by formation of the current blocking layer 6. Finally, the electrodes 8 and 7 are produced on the upper and lower surfaces of the wafer, respectively, and the wafer is cleaved to produce resonator facets, resulting in the semiconductor laser shown in FIG. 3.

In this second embodiment of the invention, the GaN buffer layer 23 comprising a compound semiconductor of the same kind as the AlGaInN semiconductor layers is formed on the low-temperature Si buffer layer 2, and the AlGaInN semiconductor layers 3 to 5 are formed on the GaN buffer layer 23. Therefore, the generation of growth nuclei is further promoted, whereby the crystalline quality of the AlGaInN layers 3 to 5 is further improved.

Also in this second embodiment, since the Si substrate 1 is cleavable, the resonator facets can be produced by cleaving. In addition, since the Si substrate 1 is electrically conductive, the structure in which a pair of electrodes are respectively located on opposed upper and lower surfaces of a light emitting device is realized. Further, since the Si substrate 1 is inexpensive, the semiconductor laser is obtained at a low cost. Furthermore, since the uppermost AlGaInN cladding layer 5 is n type, a low-resistance p type AlGaInN cladding layer 3 is realized.

Embodiment 3

Figure 4:
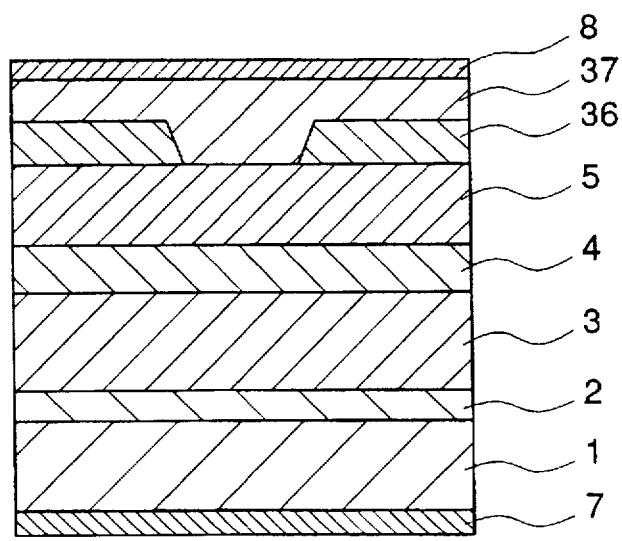
FIG. 4 is a cross-sectional view schematically illustrating a structure of a semiconductor laser in accordance with a third embodiment of the present invention.

FIG. 4 is a cross-sectional view schematically illustrating a structure of a semiconductor laser in accordance with a third embodiment of the present invention. In the figure, the same reference numerals as those in FIG. 1 designate the same or corresponding parts. In this third embodiment, a p type AlGaInN current blocking layer 36 is disposed on prescribed parts of the n type AlGaInN cladding layer 5, and an n type AlGaInN cap layer 37 is disposed on a part of the n type AlGaInN cladding layer 5 where the current blocking layer 36 is not present and on the current blocking layer 36.

The semiconductor laser shown in FIG. 4 is fabricated in the process steps described hereinafter using the MOCVD apparatus shown in FIG. 2. The process steps up to the epitaxial growth of the n type AlGaInN cladding layer 5 are identical to those already described with respect to the first embodiment and, therefore, repeated description is not necessary. After the epitaxial growth of the n type AlGaInN cladding layer 5, the p type AlGaInN current blocking layer 36 and the n type AlGaInN cap layer 37 are successively epitaxially grown. Thereafter, the electrodes 8 and 7 are produced on front and rear surfaces of the wafer, respectively, followed by cleaving to make resonator facets, thereby completing the semiconductor laser shown in FIG. 4.

In this third embodiment, since the low-temperature Si buffer layer 2 is formed on the Si substrate 1, the crystalline quality of the AlGaInN layers 3–5, 36, and 37 is improved.

Further, in this third embodiment, since the Si substrate 1 is cleavable, the resonator facets can be produced by cleaving. In addition, since the Si substrate 1 is electrically conductive, a structure in which a pair of electrodes are respectively located on opposed upper and lower surfaces of a light emitting device is realized. Further, since the Si substrate 1 is inexpensive, the semiconductor laser is obtained at a low cost. Furthermore, since the AlGaInN cladding layer 5 is n type, a low-resistance p type AlGaInN cladding layer 3 is realized.

Embodiment 4

Figure 5:
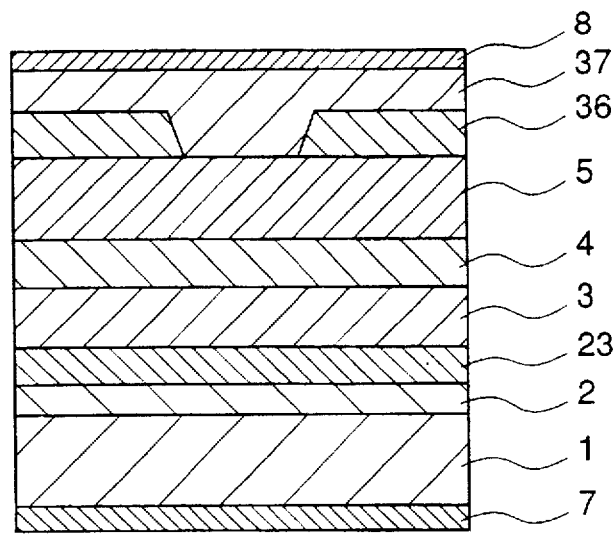
FIG. 5 is a cross-sectional view schematically illustrating a structure of a semiconductor laser in accordance with a fourth embodiment of the present invention.
Figure 6:
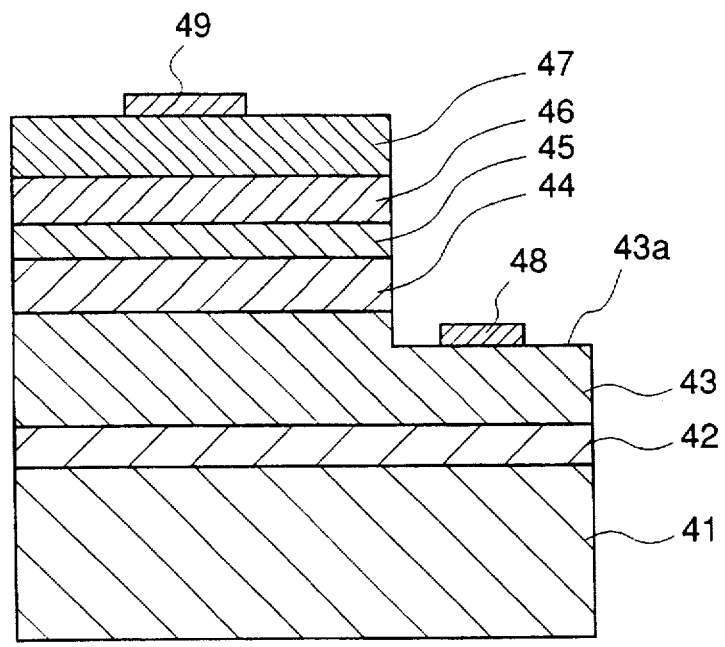
FIG. 6 is a cross-sectional view schematically illustrating a structure of a blue-LED in accordance with the prior art.

FIG. 5 is a cross-sectional view schematically illustrating a structure of a semiconductor laser in accordance with a fourth embodiment of the invention. In the figure, the same reference numerals as those in FIG. 4 designate the same or corresponding parts. The structure shown in FIG. 5 is fundamentally identical to the structure shown in FIG. 4 except that a GaN buffer layer 23 is disposed on the low-temperature Si buffer layer 2, and the p type AlGaInN cladding layer 3, the undoped AlGaInN active layer 4, the n type AlGaInN cladding layer 5, the p type AlGaInN current blocking layer 36, and the n type AlGaInN cap layer 37 are disposed on the GaN buffer layer 23.

The semiconductor laser shown in FIG. 5 is fabricated in the process steps described hereinafter using the MOCVD apparatus shown in FIG. 2. The process steps up to the epitaxial growth of the n type AlGaInN cladding layer 5 are identical to those already described with respect to the second embodiment and, therefore, repeated description is not necessary. After the epitaxial growth of the n type AlGaInN cladding layer 5, the p type AlGaInN current blocking layer 36 and the n type AlGaInN cap layer 37 are successively epitaxially grown. Thereafter, the electrodes 8 and 7 are produced on front and rear surfaces of the wafer, respectively, followed by cleaving to make resonator facets, thereby completing the semiconductor laser shown in FIG. 5.

In this fourth embodiment of the invention, the GaN buffer layer 23 comprising a compound semiconductor of the same kind as the AlGaInN semiconductor layers is formed on the low-temperature Si buffer layer 2, and the AlGaInN semiconductor layers 3–5, 36, and 37 are grown on the GaN buffer layer 23. Therefore, the generation of growth nuclei is further promoted, whereby the crystalline quality of the AlGaInN layers 3–5, 36, and 37 is further improved.

Also in this fourth embodiment, since the Si substrate 1 is cleavable, the resonator facets can be produced by cleaving. In addition, since the Si substrate 1 is electrically conductive, the structure in which a pair of electrodes are respectively located on opposed upper and lower surfaces of a light emitting device is realized. Further, since the Si substrate 1 is inexpensive, the semiconductor laser is obtained at a low cost. Furthermore, since the AlGaInN cladding layer 5 is n type, a low-resistance p type AlGaInN cladding layer 3 is realized.

While in the first to fourth embodiments Si is employed as a material of the low-temperature buffer layer 2, SiC may be employed with the same effects as described above. Further, in the laminated structure of the semiconductor layers, although the n type layers are located on the p type layers, the p type layers may be located on the n type layers.

Further, although MOCVD is employed for the growth of the semiconductor layers, MBE (Molecular Beam Epitaxy) or CBE (Chemical Beam Epitaxy) may be employed with the same effects as described above. In addition, although the second buffer layer 23 comprises GaN, it may comprise AlN or AlGaN.

In the first to fourth embodiments of the invention, emphasis has been placed upon a semiconductor laser. However, the fundamental structure and fabricating method according to the present invention may be applied to a light emitting diode.

What is claimed is:

1. A semiconductor light emitting device comprising:

an Si substrate having opposed front and rear surfaces;

an amorphous or polycrystalline first buffer layer of Si disposed on the front surface of the Si substrate; and a plurality of GaN series compound semiconductor layers successively disposed on the first buffer layer and including a light emitting region where light is produced by recombination of electrons and holes.

2. The semiconductor light emitting device of claim 1 further comprising an $Al_xGa_{1-x}N$ ($0 \leq x \leq 1$) second buffer layer interposed between the first buffer layer and the GaN series compound semiconductor layers.

3. The semiconductor light emitting device of claim 1 further comprising first and second electrodes for supplying electrons and the holes to light emitting region, the first electrode being disposed on the rear surface of the Si substrate and the second electrode being disposed on the GaN series compound semiconductor layers.

* * * * *